United States Patent
Sobel

(10) Patent No.: US 9,563,573 B2
(45) Date of Patent: Feb. 7, 2017

(54) PRECHARGE DISABLE USING PREDECODED ADDRESS

(71) Applicant: Advanced Micro Devices, Inc., Sunnyvale, CA (US)

(72) Inventor: Matthew T. Sobel, Acton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 579 days.

(21) Appl. No.: 13/970,735

(22) Filed: Aug. 20, 2013

(65) Prior Publication Data

US 2015/0058575 A1 Feb. 26, 2015

(51) Int. Cl.

| | |
|---|---|
| *G06F 12/00* | (2006.01) |
| *G06F 13/00* | (2006.01) |
| *G06F 13/28* | (2006.01) |
| *G06F 12/12* | (2016.01) |
| *G11C 7/12* | (2006.01) |
| *G11C 11/419* | (2006.01) |

(52) U.S. Cl.
CPC .............. *G06F 12/121* (2013.01); *G11C 7/12* (2013.01); *G11C 11/419* (2013.01)

(58) Field of Classification Search
CPC .. G06F 12/0828; G06F 12/121; G11C 11/419; G11C 7/12
USPC .................................................. 711/133, 118
See application file for complete search history.

(56) References Cited

U.S. PATENT DOCUMENTS

| | | | | |
|---|---|---|---|---|
| 5,329,492 | A | * | 7/1994 | Mochizuki ............. G11C 5/025 365/205 |
| 5,615,168 | A | * | 3/1997 | Lattimore ............ G11C 7/1072 365/203 |
| 5,742,622 | A | * | 4/1998 | Claydon ........... H03M 13/1515 714/789 |
| 5,808,959 | A | * | 9/1998 | Kengeri ............... G11C 7/1072 365/230.06 |
| 5,819,057 | A | * | 10/1998 | Witt ..................... G06F 9/30036 712/204 |
| 5,832,297 | A | * | 11/1998 | Ramagopal ......... G06F 9/30047 710/5 |
| 5,848,015 | A | * | 12/1998 | Seno ........................ G11C 7/12 365/203 |
| 5,848,433 | A | * | 12/1998 | Tran ...................... G06F 9/3806 711/118 |
| 2002/0015345 | A1 | * | 2/2002 | Fournel ................. G11C 16/24 365/207 |
| 2005/0162951 | A1 | * | 7/2005 | Dudeck .................... G11C 7/12 365/203 |
| 2007/0094479 | A1 | * | 4/2007 | Bearden ................. G06F 9/345 711/220 |

(Continued)

*Primary Examiner* — Sheng-Jen Tsai

(57) ABSTRACT

A memory can be a sum addressed memory (SAM) that receives, for each read access, two address values (e.g. a base address and an offset) having a sum that indicates the entry of the memory to be read (the read entry). A decoder adds the two address value to identify the read entry. Concurrently, a predecode module predecodes the two address values to identify a set of entries (e.g. two different entries) at the memory, whereby the set includes the entry to be read. The predecode module generates a precharge disable signal to terminate precharging at the set of entries which includes the entry to be read. Because the precharge disable signal is based on predecoded address information, it can be generated without waiting for a full decode of the read address entry.

14 Claims, 6 Drawing Sheets

(56) References Cited

U.S. PATENT DOCUMENTS

| | | | | |
|---|---|---|---|---|
| 2007/0201298 A1* | 8/2007 | Ramaraju | ............... | G11C 7/02 |
| | | | | 365/230.06 |
| 2007/0280030 A1* | 12/2007 | Ramaraju | ............... | G11C 7/02 |
| | | | | 365/230.06 |
| 2011/0296097 A1* | 12/2011 | Elnozahy | ............ | G11C 11/4094 |
| | | | | 711/106 |
| 2014/0022853 A1* | 1/2014 | Choi | ..................... | G11C 16/24 |
| | | | | 365/189.05 |

\* cited by examiner

PRECHARGE DISABLE USING PREDECODED ADDRESS

BACKGROUND

Field of the Disclosure

The present disclosure relates generally to processing systems and more particularly to memory access for processing systems.

Description of the Related Art

A processing system typically employs random access memory (RAM) to store data used for processing operations. The memory has a plurality of entries (e.g. rows or lines), whereby each entry includes a set of bit cells to store the individual bits of the entry. In response to a read access request, the processing system can read data from an entry using a read operation having two phases: a precharge phase and an evaluate phase. During the precharge phase, the memory precharges bitlines for the memory bitcells to a defined voltage representing an asserted logic level (e.g. a logic value of "1"). During the evaluate phase, the memory stops precharging of the bitcells of the entry to be read, so that the bitlines connected to the bitcells are each set to a voltage level representing the data stored at their corresponding bit cell.

During the evaluate phase of a read operation, precharging of the bitlines of the entry to be read (referred to for purposes of description as "read bitlines") must be terminated. However, for some types of memories it is necessary to maintain, during the evaluate phase, precharging of bitlines for bitcells that are not the subject of the read operation (referred to for purposes of description as "non-read bitlines"). For example, some memories logically combine bitlines of different memory entries during the evaluate phase in order to output each bit of the data being read. The logical combination is such that it outputs a correct result (i.e. the output of the logical combination correctly represents a bit of the data to be read) if the bitlines for all of the entries that are not being read are maintained at a precharge level. That is, if the bitlines for the entries that are not being read are not kept at the precharge level during the evaluate phase, it substantially increases the likelihood of an error in the data being read. Accordingly, during the evaluate phase it is useful to terminate precharging only for the bitlines of the read bitcells. In some systems, this is done by generating a precharge disable signal by logically ORing (combining using an OR operation) read wordlines of a group of memory entries, including the read entry, together. However, this technique can cause delays in completing the read operation.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF EMBODIMENTS

FIGS. 1-8 illustrate techniques for improving memory access latency and read accuracy by terminating precharging bitlines of a set of memory entries based on a predecoded address. In some embodiments, the memory is a sum addressed memory (SAM) that receives, for each read access, two address values (e.g. a base address and an offset) having a sum that indicates the entry of the memory to be read (the read entry). A decoder adds the two address values to identify the read entry. Concurrently, a predecode module predecodes the two address values to identify a set of entries (e.g. two different entries) at the memory, whereby the set includes the entry to be read. The predecode module generates a precharge disable signal to terminate precharging for a set of bitlines including the bitlines which are connected to the entry to be read. Precharging is maintained at other sets of bitlines that do not include the entry to be read in order to improve read accuracy. Because the precharge disable signal is based on predecoded address information, it can be generated without waiting for a full decode of the read address entry, improving access latency and read accuracy.

Figure 1:
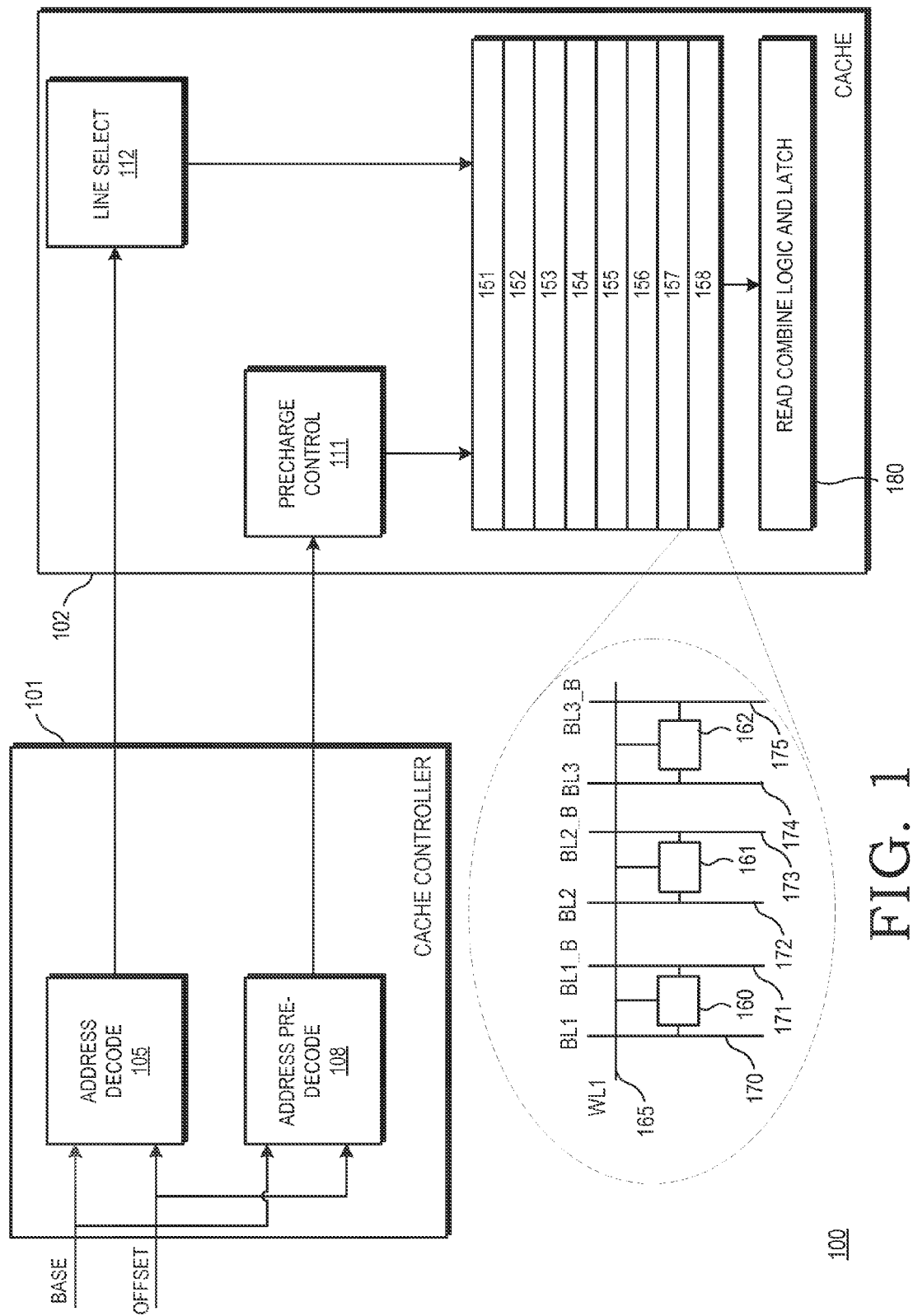
FIG. 1 is a block diagram of a processing system in accordance with some embodiments.

FIG. 1 illustrates a block diagram of a processing system 100 in accordance with some embodiments. The processing system 100 can be a part of a desktop computer, laptop, server, computing-enabled phone, game console, set-top box, or any other device that employs a processor to execute sets of instructions. In particular, the processing system 100 includes one or more processor cores (not shown) that together execute sets of instructions (e.g. computer programs) in order to carry out operations defined by the instruction sets. To facilitate completion of the operations, the processing system 100 includes memory devices, including the illustrated cache 102, that store data to be used by the executing sets of instructions. In the course of executing particular instructions, referred to as memory access instructions, the processing system 100 generates memory access operations to store or retrieve data from the memory devices. For example, in response to executing a read instruction, the processing system 100 generates a read operation to retrieve data from the memory devices. In response executing a write instruction, the processing system 100 generates a write operation to store data at the memory devices. The read and write operations generated by the processing system 100 are collectively referred to as "memory access operations."

Each memory access operation targets a particular location associated with the memory devices, wherein the location is identified by a memory address. In some embodiments, a memory address can be associated with entries at different memory devices that store the same data. For example, the memory devices can be arranged in a memory hierarchy, wherein the cache 102 is located at the highest level of the memory hierarchy and other memory devices (e.g. one or more lower level caches, system random access memory (RAM), disk drives, and the like) are located at lower levels of the memory hierarchy. A given memory address identifies an entry at each level of the memory hierarchy that stores data corresponding to the memory address.

For each memory access operation, the processing system 100 identifies the memory address targeted by the operation. In some embodiments, the processing system 100 identifies the memory address by generating two values or more values, referred to herein as "memory address components". For example, in some embodiments the memory address components identified by the processing system 100 include a base address value and an offset value, wherein the memory address for the memory access operation is the sum of the base address value and the offset value. As described further herein, in response to a memory access operation the processing system 100 combines the memory address components to identify the memory address. This combining of the memory address components and generating the signaling that identifies a particular memory entry is referred to herein as "decoding" the memory address. For example, if the memory address components are a base address value and an offset value, the processing system 100 decodes the memory address by adding the base address value and the offset value. "Predecoding" a memory address, as used herein, refers to combining memory address components to identify a "partial" memory address, wherein the partial memory address identifies multiple memory addresses. As described further herein, in some embodiments the processing system 100 predecodes the memory address components of a memory address to identify sets of entries at the cache 102 for which precharging can be disabled, thereby improving access latency at the cache 102.

To illustrate, the cache 102 includes multiple entries, referred to as lines, such as lines 151-158. Each of the cache lines 151-158 includes a set of bitcells connected to corresponding bitlines and a corresponding wordline. For example, line 158 includes bitcells 160-162 connected to wordline 165. Bitcell 160 is connected to differential bitlines 170 and 171, bitcell 161 is connected to differential bitlines 172 and 173, and bitcell 162 is connected to differential bitlines 174 and 175. To facilitate access to the lines 151-158, the cache 102 includes a precharge control module 111 and a line select module 112. For a read operation, the cache 102 implements two phases: a precharge phase and an evaluate phase. During the precharge phase, the precharge control module 111 sends control signaling to precharge the bitlines for all of the entries 151-158 to a defined voltage. During the evaluate phase, the precharge control module 111 sends control signaling to discontinue precharging at the bitlines for a set of cache lines including the cache line corresponding to the decoded memory address of the read operation. In addition, the line select module 112 identifies the cache line corresponding to the decoded memory address and asserts a signal at the wordline for the identified cache line. In response, the bitlines of the identified cache line are each set to states corresponding to the data stored at the corresponding bit line. For example, if the bitcell 160 stores an asserted logic value (e.g. a logic value of "1") the bitline 170 remains at the precharged level while the bitline 171 is pulled to a voltage representing a negated logic value. Read combine logic and latch 180 logically combines the bitlines of different ones of the entries 151-158 to identify the values stored at each of the bitcells in the read entry, and latches the resulting read data for subsequent access by the processor.

In some embodiments, because the bitlines of the entries 151-158 are differential bitlines, it is useful to maintain precharging at some of the bitlines of the cache lines 151-158 that are not the target of the read operation. In particular, if precharging at the selected bitlines is terminated during the evaluate state, the differential bitlines can enter an uncertain or "floating" state, whereby they output unknown data on their corresponding bitlines. This can cause the read combine logic 180 to incorrectly generate the output read data. Accordingly, the precharge control module 111 uses predecoded address information to identify a subset of the cache lines 151-158 (referred for purposes of description as a "precharge subset") that includes the cache line targeted by the read operation, and during the evaluate phase selectively disables precharging at only the bitlines for the identified precharge subset, while maintaining precharging at the bitlines for the other precharge subsets. In some embodiments, the bitcells of a precharge subset share corresponding bitlines. For example, a precharge subset can include entries 156, 157, and 158. Accordingly, in this example, bitlines 170 and 171 are connected to bitcell 160 for entry 158, another bitcell (not shown) for entry 157, and still another bitcell (not shown) for entry 156. Similarly, bitlines 172 and 173 are connected to bitcell 161 for entry 158, another bitcell (not shown) for entry 157, and still another bitcell (not shown) for entry 156. Thus, each bitline of the precharge subset is connected to a corresponding bitcell for each of the entries 156-158. Each of the entries 156-158 is connected to a different wordline, allowing the entries to be read individually.

The read combine logic 180 is configured such that terminating precharging for all of the entries of a precharge subset will not affect generation of the correct read data for an entry in that precharge subset. Accordingly, precharging can be terminated for all of the entries in a precharge subset, as long as it is maintained at the other precharge subsets that do not include the read entry.

To illustrate, the cache lines 151-158 can be grouped such that cache lines 151-153 are in one precharge subset, cache lines 154-156 are in a different precharge subset, and cache lines 157 and 158 are in still another precharge subset. Grouping the cache lines into different precharge subsets allows the read combine logic 180 to determine and latch the read data more quickly. Accordingly, for each read operation the precharge control module 111 uses the predecoded address information to identify the precharge subset of cache lines 151-158 that includes the read cache line and, during the evaluate phase of the read operation, terminates precharging only fir the identified precharge subset, while maintaining the bitlines of the other precharge subsets at their precharged voltage. Because the precharge subset that includes the read cache line is identified based on predecoded address information, the precharge subset can be identified prior to a full decode of the memory address, thereby reducing access latency at the cache 102.

To facilitate decoding and predecoding of the memory address, the processing system 100 includes a cache controller 101 having an address decode module 105 and an address predecode module 108. For each read operation, the address decode module 105 receives the corresponding base address and offset and performs an addition of these memory address components to identify a memory address. The address decode module decodes the memory address to identify the particular one of the cache lines 151-158 that is the read cache line. The address predecode module 108 predecodes the base address and offset to generate the predecoded address information that indicates the precharge subset of the cache lines 151-158 that includes the read cache line. In some embodiments, the address decode module 105 and the address predecode module 108 perform their respective operations concurrently, such that the predecoded address information is available prior to the decoded address. This allows the precharge control module 111 to terminate precharging at the precharge subset of the cache lines 151-158 that includes the read cache line prior to the line select module 112 activating the wordline for the read cache line, thereby reducing access latency to the read cache line. In some embodiments the address decode module 105 employs the predecoded output of the predecode module 108 to more quickly generate the full sum of the memory address components.

In some embodiments, the address decode module 105 performs a full addition of the base address and offset, including propagation of carry values as each bit of these memory address components are added. In contrast, the address predecode module 108 predecodes the memory address components by performing carry-save additions (CSA) of the memory address components and the memory addresses for the cache lines 151-158. To illustrate, if the base address is designated as value "A", the offset is designated as value "B", and the address for a particular cache line is designated as value "D", the address predecode module 108 performs a different carry save addition for each entry to predict whether A+B–D is equal to zero. If the predicted result of the addition by A+B–D is equal to zero, that indicates a prediction that the cache line corresponding to address D is the read cache line.

Because the predecode module 108 does not perform a full addition, with carry propagation, of the memory address components A and B and the address D, it identifies two different candidate subsets of cache lines that may include the read cache line. The candidate subsets are subsets of cache lines smaller than the precharge subsets. For example, the precharge subsets for the cache 102 may each include 4 cache lines, and each candidate subset may include 2 cache lines. In some embodiments, the address predecode module 108 does not add all the bits of the values A, B and D, but instead adds only those portions that differentiate between different precharge subsets. For purposes of description, the portion of the address A+B that does not differentiate between different candidate subsets added is referred to as the "encoded sub-index" and the most significant bit of that encoded sub-index is referred to as the "sub-index MSB". As explained further below, the sub-index MSB is used in certain circumstances to identify which precharge subset includes the read cache line.

After identifying the two candidate subsets, the predecode module 108 then identifies which precharge subset includes the read cache line as follows: if the two candidate subsets are in the same precharge subset, it identifies that precharge subset. If the two candidate subsets are in different precharge subsets, it identifies one of the subsets based on the sub-index MSB of the address D being compared as described further herein. The predecode module 108 indicates the identified subset to the precharge control module 111. In response, during the evaluate phase of the corresponding read operation, the precharge control module 111 terminates precharging only for the identified subset of cache lines, while maintaining precharging at the other, non-identified subsets.

Figure 2:
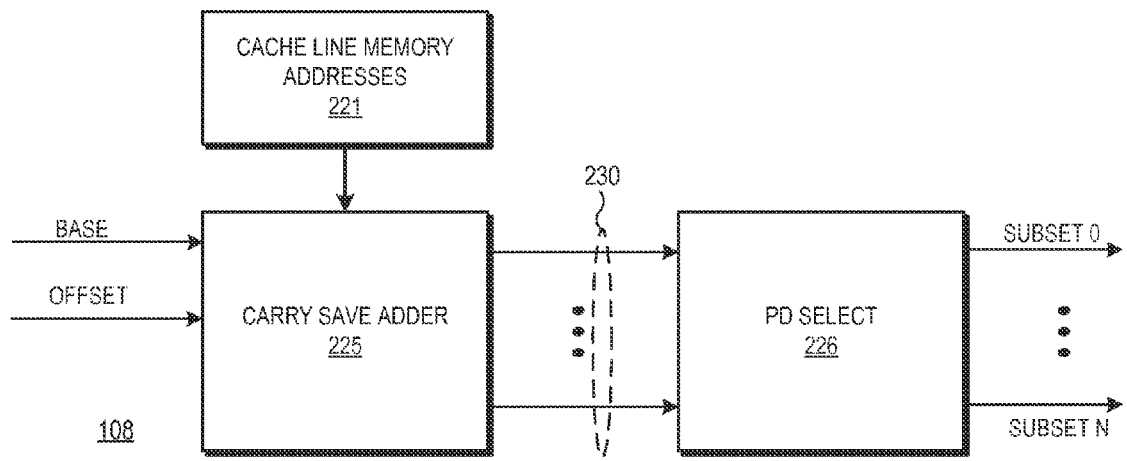
FIG. 2 is a block diagram of an address predecode module of the processing system of FIG. 1 in accordance with some embodiments.

FIG. 2 illustrates a block diagram of the predecode module 108 in accordance with some embodiments. In the illustrated example, the predecode module 108 includes a carry save adder (CSA) 225 a predecode disable (PD) select module 226, and a storage module that stores cache line memory addresses 221 for the cache 102. The storage module can be, for example, a set bit cells that collectively store the corresponding memory address for each cache line of the cache 102.

The CSA 225 is configured to receive the base address value and offset value for a read operation and to perform a set of addition operations to identify two candidate subsets. In particular, each of the set of additions adds a portion of the base address value, the offset value, and a complement of a corresponding portion of a subset of the cache line memory addresses 221. In some embodiments, the addition is done in two stages: first, the three values A, B, and D are compressed into 2 values using carry-save addition without allowing propagation of any carry values for the addition. Next the 2 values are added to determine the addition operation result. A value of "0" at any bit position of the addition operation result indicates that the sum of the base value and offset value do not match the corresponding portion of the cache line memory addresses, and therefore that the read operation does not target the subset of cache lines corresponding to the portion of cache line memory addresses. In contrast, a value of "1" at each bit position of the addition operation result indicates that the sum of the base value and offset value portions potentially matches at least one of the corresponding cache line memory address subsets, and therefore that one of the corresponding cache line subsets is a potential target of the read operation. Because the CSA 225 performs its addition operations without knowing the value of the carry in that would result from the addition of the address bits corresponding to the encoded sub-index, two consecutive addition operation results will have a value of 1 at each bit position. Accordingly, the CSA 225 identifies two potential candidate subsets of cache lines as including the target cache line of the read operation. Because the other variable in the addition is the carry in the candidate subsets will be consecutive values.

Based on the results of the addition operations, the CSA 225 generates a set 230 of output signals whereby each output signal corresponds to a subset of the cache lines at the cache 102. An asserted signal of the set 230 indicates that the corresponding cache line subset is a candidate subset (i.e. includes a potential target of the read operation), while a negated signal of the set indicates that the corresponding subset of cache lines is not a candidate subset. Because the CSA 225 identifies two consecutive candidate subsets, two of the set 230 of output signals will be asserted for each read operation.

The PD select module 226 receives the set 230 of output signals and identities one of the precharge subsets of cache lines based on which signals of the set 230 are asserted. If the asserted signals of the set 230 correspond to cache line subsets in the same precharge subset, the PD select module 226 identifies that precharge subset. If the asserted signals of the set 230 correspond to cache lines in different precharge subsets of the cache 102, the PD select module 226 identifies the precharge subset based on the sub-index MSB. In particular, if the sub-index MSB is a negated value (e.g. a value of "0"), the "higher" of the two consecutive candidate subsets (that is, the candidate subset corresponding to higher address values) includes the cache line that is the actual target of the read operation. The PD select module 226 therefore identifies the precharge subset including the higher candidate subset. In contrast, if the LSB of the encoded memory address value is an asserted value (e.g. a value of "1"), the "lower" of the two consecutive candidate subsets (that is, the candidate subset corresponding to lower address values) includes the cache line that is the actual target of the read operation. The PD select module 226 therefore identifies the precharge subset including the lower of the candidate subsets. The PD select module 226 generates one or more output signals to indicate the identified precharge subset to the precharge control module 111 (FIG. 1), which disables precharging to the identified set during the evaluate phase of the read operation.

Figure 3:
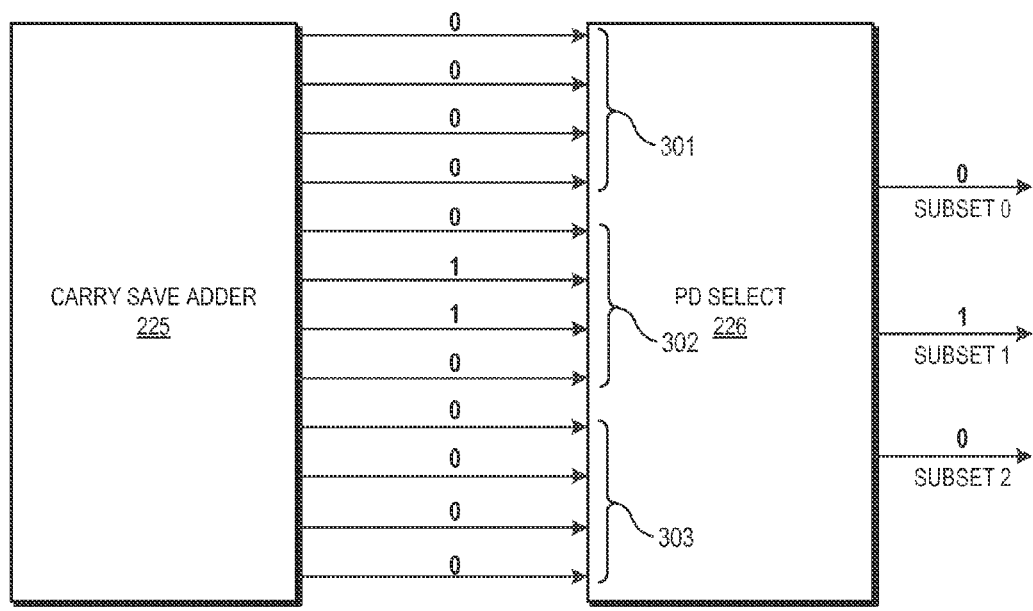
FIG. 3 is a diagram illustrating an example operation of the address predecode module of FIG. 2 in accordance with some embodiments.
Figure 4:
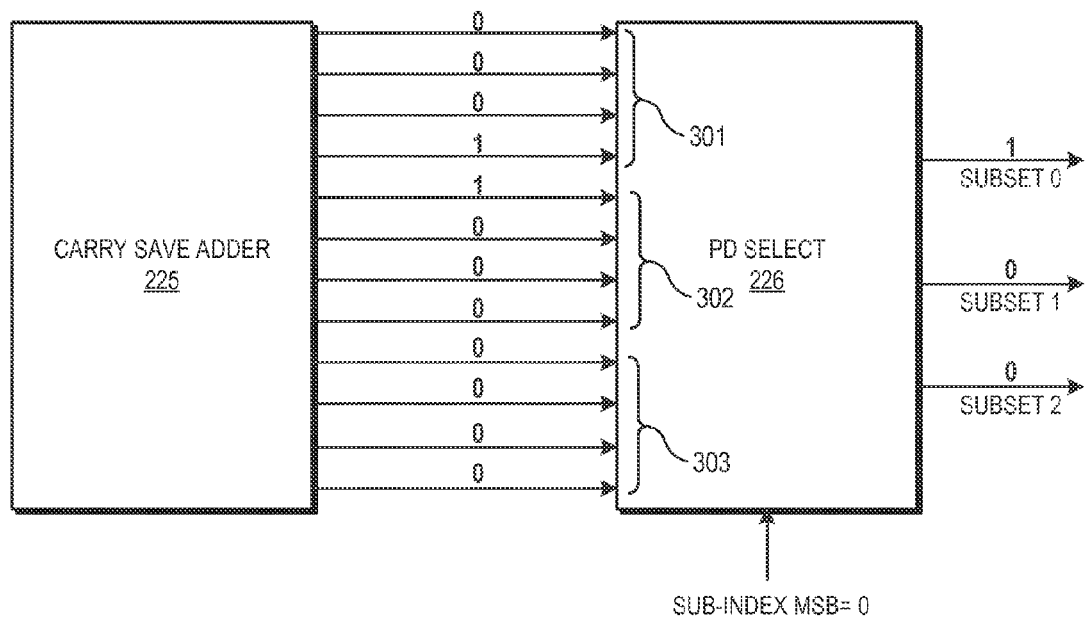
FIG. 4 is a diagram illustrating another example operation of the address predecode module of FIG. 2 in accordance with some embodiments.
Figure 5:
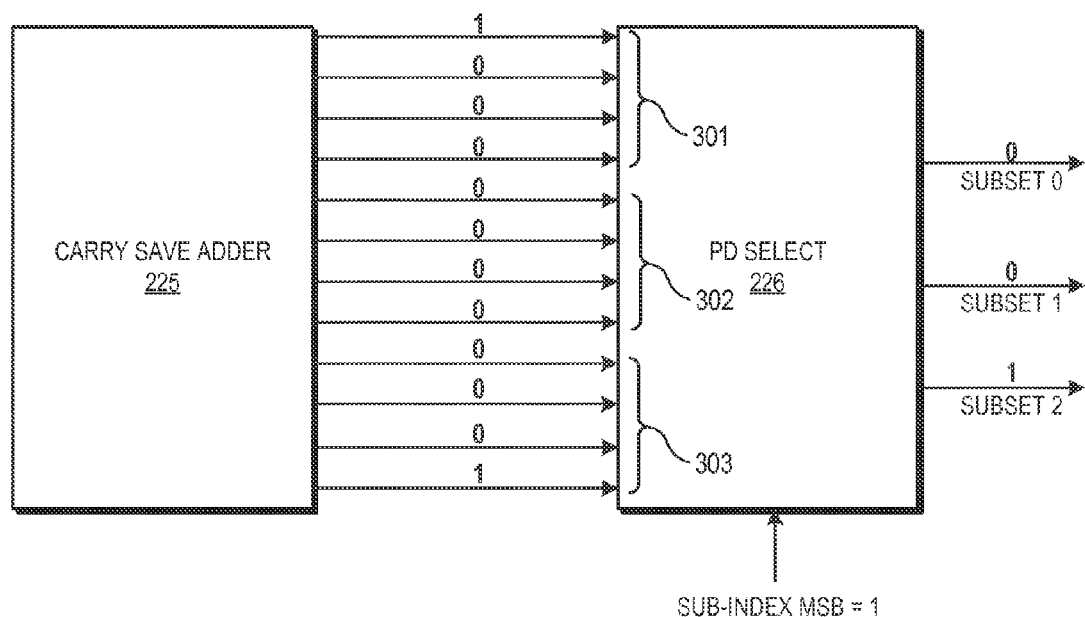
FIG. 5 is diagram illustrating another example operation of the address predecode module of FIG. 2 in accordance with some embodiments.

FIGS. 3-5 illustrate example operations of the predecode module 108 of FIG. 2 in accordance with some embodiments. For each example operation, the CSA 225 provides a set of output signals, wherein each output signal corresponds to a different subset of cache lines of the cache 102. An asserted output signal of the CSA 225, as indicated by a value "1", indicates that the CSA 225 has calculated that a portion of the values A+B−D is equal to zero, where A and B are the address components for a read operation and D is the memory address for the corresponding cache line. Accordingly, an asserted output signal indicates an assessment by the CSA 225 that the corresponding cache line subset is a candidate subset that potentially includes the cache line targeted by the read operation. In contrast, a negated output signal of the CSA 225, as indicated by a value "0", indicates an assessment by the CSA 225 that the corresponding subset of cache lines is not a candidate subset. As explained above, because the CSA 225 does not include the carry in from the addition of candidate sub-index address bits, the CSA 225 identifies two consecutive candidate subsets as including potential targets of the read operation. Accordingly, in each of the example operations illustrated at FIGS. 3-5 two consecutive output signals will be asserted by the CSA 225.

In addition, in the illustrated examples of FIGS. 3-5, it is assumed that the cache lines of the cache 102 are configured into three different precharge subsets, identified as "Subset 0", "Subset 1", and "Subset 2". Accordingly, the output signals of the CSA 225 are organized into groups 301-303 based on which of the Subsets 1-3 include the corresponding cache line subsets for the output signals. Thus, group 301 is the group of output signals corresponding to the cache line subsets of precharge Subset 0, group 302 is the group of output signals corresponding to the cache line subsets of precharge Subset 1, and group 303 is the group of output signals corresponding to the cache line subsets of precharge Subset 2.

The PD select module 226 includes an output signal for each of Subsets 1-3 and asserts one of the output signals based on which of the output signals of the CSA 225 are asserted. If the two asserted output signals of the CSA 225 are in the same group, the PD select module 226 asserts the output signal for the precharge subset corresponding to the group. Thus, in the example of FIG. 3, the asserted output signals of the CSA 225 are both in group 302, indicating that both of the cache lines that are potential targets of the read operation are in Subset 1. Accordingly, the PD select module 226 asserts the output signal for Subset 1. In response, the precharge control module 111 (FIG. 1) terminates precharging for the bitlines of the cache lines of Subset 1 during the evaluate phase of the read operation, while maintaining precharging for the bitlines of the cache lines of Subset 0 and Subset 2 for the evaluate phase.

If the asserted output signals of the CSA 225 are in two different ones of the groups 301-303, the PD select module 226 identifies one of the precharge subsets corresponding to the two groups based on the sub-index MSB. In particular, if the sub-index MSB has a value zero, this indicates that the cache line corresponding to the lower address value is the target of the read operation and the PD select module 226 asserts the output signal for the subset containing that cache line. In contrast, if the sub-index MSB has a value one, this indicates that the cache line corresponding to the higher address value is the target of the read operation and the PD select module 226 asserts the output signal for the subset containing that cache line. For example, in FIG. 4 the CSA 225 has asserted an output signal in group 301, corresponding to a cache line of Subset 0 and an output signal in group 302, corresponding to a cache line of Subset 1. In addition, the sub-index MSB in the example of FIG. 4 has a value of one. Further, it is assumed that the address values for the cache lines of Subset 0 are higher than the address values for the cache lines of Subset 1. Accordingly, because the sub-index MSB has a value of 1, the PD select module 226 identifies that the cache lines of Subset 0 are the potential targets of the read operation, and therefore asserts the output signal for Subset 0.

In the example of FIG. 5, the CSA 225 has asserted an output signal in group 301, corresponding to a cache line of Subset 0 and an output signal in group 303, corresponding to a cache line of Subset 2. In addition, the sub-index MSB in the example of FIG. 4 has a value of zero. Further, it is assumed that the address values for the cache lines of Subset 0 are higher than the address values for the cache lines of Subset 2. Accordingly, because the sub-index MSB has a value of zero, the PD select module 226 identifies that the cache lines of Subset 2 are the potential targets of the read operation, and therefore asserts the output signal for Subset 2.

Figure 6:
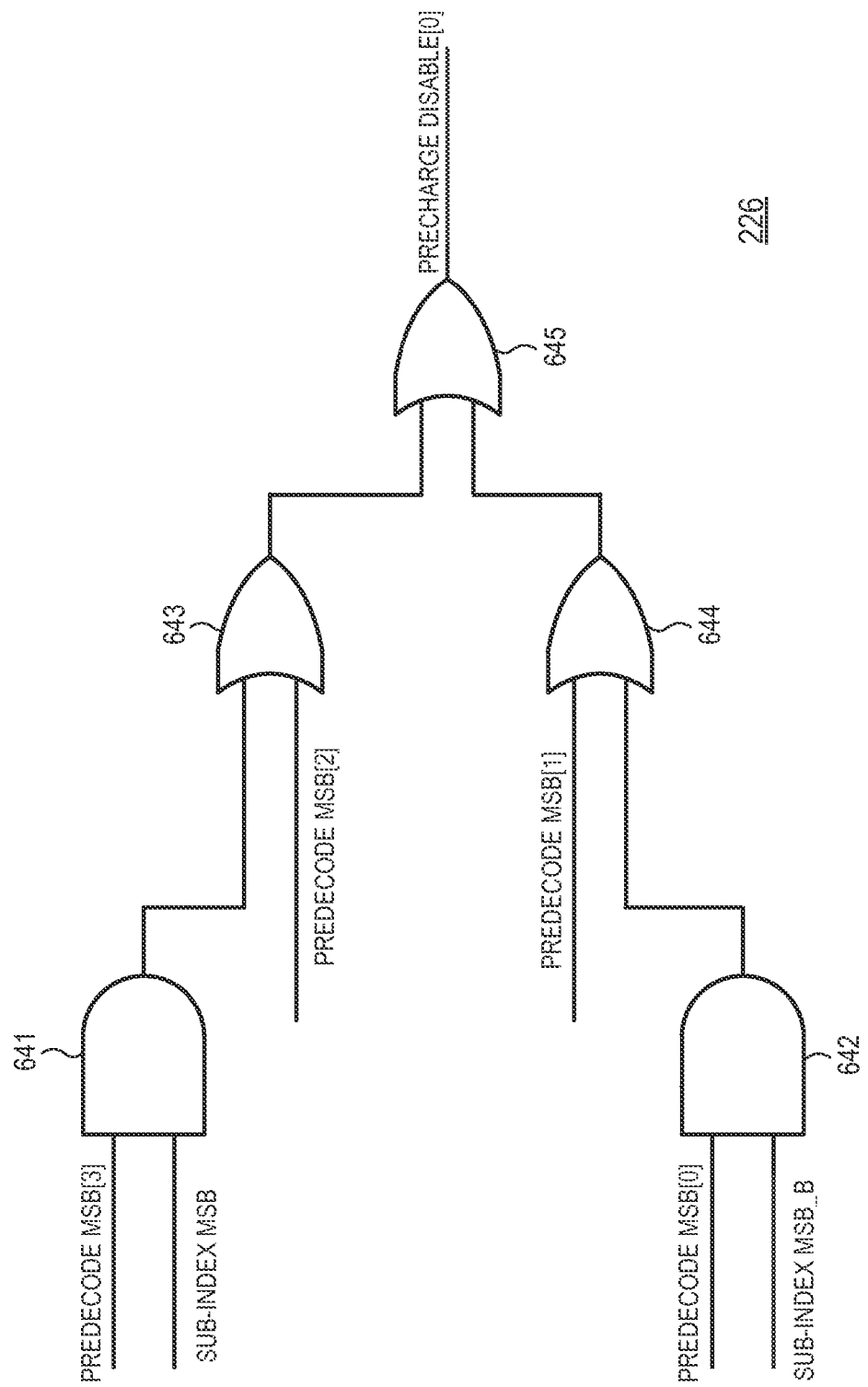
FIG. 6 is a diagram illustrating a portion of a predecode disable select module of FIG. 2 in accordance with some embodiments.

FIG. 6 illustrates a portion of the PD select module 226 in accordance with some embodiments of the present disclosure. In particular, FIG. 6 illustrates logic to generate one of the output signals of the PD select module 226, corresponding to one subset of the cache lines of the cache 102. The input signals for the illustrated portion of the PD select module 226 are denoted as follows: Predecode MSB[X], where X corresponds to the output of the CSA 225 shown in FIG. 2 corresponding to the sum of the decoded of the address components A and B and the complement of the address value D at bit position X, without propagation of a carry value. Thus, Predecode MSB[1] refers to the output of the CSA 225 indicating the sum of A[1]+B[1]=01.

The PD select module 226 includes AND gates 641 and 642 and OR gates 643-645. The AND gate 641 includes an input to receive Predecode MSB[3], an input to receive the sub-index MSB, and an output. The AND gate 642 includes an input to receive Predecode MSB[0], an input to receive the complement of the sub-index MSB, and an output. The OR gate 643 includes an input connected to the output of the AND gate 641, an input to receive Predecode MSB[2], and an output. The OR gate 644 includes an input connected to the output of the AND gate 642, an input to receive Predecode MSB[1], and an output. The OR gate 645 comprises an input connected to the output of the OR gate 643, an input connected to the output of the OR gate 644, and an output to provide the output signal for Subset 2.

In operation, the Predecode MSBs 0-3 are generated by the CSA 225 such that two of the signals are asserted. If both of those signals are in the group corresponding to Subset 2 (that is, if both of the two asserted signals are in the group of Predecode MSBs 0-3), the output signal of the OR gate 645 for that subset will be asserted. If the Predecode MSBs are such that only one of Predecode MSB[0] and Predecode MSB[3] is asserted, then the two asserted Predecode MSBs correspond to different subsets of the cache lines at the cache 102. Accordingly, the output of the OR gate 645 for each subset is based on the sub-index MSB. That is, the sub-index MSB indicates whether the cache line targeted by the read operation is in Subset 2 or in a different subset. The PD select module 226 includes similar logic to that illustrated in FIG. 2 for each set of Predecode MSBs corresponding to the precharge subsets of the cache lines of cache 102. Accordingly, the sub-index MSB is employed to identify the correct precharge subset when that cache lines predicted to be targeted by the CSA 225 are in different precharge subsets.

Figure 7:
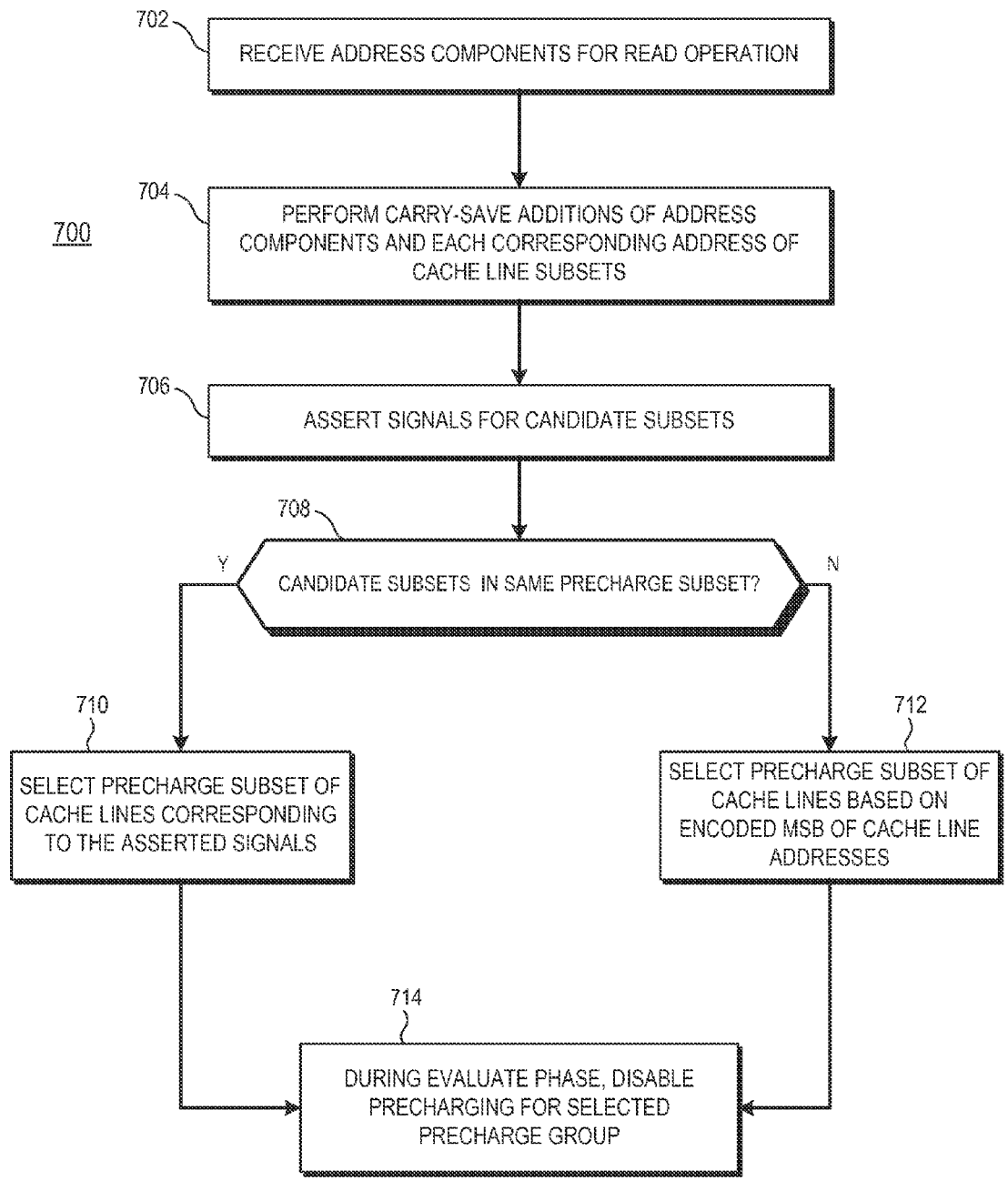
FIG. 7 is a flow diagram illustrating a method of predecoding address components to identify a subset of memory entries for precharging termination in accordance with some embodiments.

FIG. 7 illustrates a flow diagram of a method 700 of predecoding address components to identify a subset of memory entries for precharging termination in accordance with some embodiments. For purposes of description, the method 700 is described with respect to an example implementation at the processing system 100 of FIG. 1 and the address predecode module 108 of FIG. 2. At block 702 the cache controller 101 receives a base address value and an offset value as the memory address components for a read operation. At block 704 the CSA 225 performs carry-save additions to generate output signals indicating whether sum of the memory address components and corresponding ones of the memory addresses for the cache lines of the cache 102 equal zero. The CSA 225 thereby indicates a prediction as to which cache line subsets of the cache 102 are candidates to be the target of the read operation. At block 706 the CSA 225 asserts output signals corresponding to the candidate subsets.

At block 708 the PD select module 226 uses the asserted output signals of the CSA 225 to identify whether the candidate subsets are in the same precharge subset. If so, the method flow moves to block 710 and the PD select module selects the precharge group as the group to which both of the assert output signal corresponds. The method flow moves to block 714, and the precharge control module 111 disables precharging for the selected precharge group during the evaluate phase of the read operation, while maintaining precharging at the bitlines of the other precharge groups.

Returning to block 708, if the PD select module 226 identifies the candidate subsets as belonging to two precharge groups, the method flow moves to block 712 and the PD select module 226 uses the sub-index MSBs of the addresses of the candidate subsets to identify which of the candidate cache lines is the actual target of the read operation. The method flow moves to block to block 714, and the precharge control module 111 disables precharging for the selected precharge group during the evaluate phase of the read operation, while maintaining precharging at the bitlines of the other precharge groups.

In some embodiments, the apparatus and techniques described above are implemented in a system comprising one or more integrated circuit (IC) devices (also referred to as integrated circuit packages or microchips), such as the processing system described above with reference to FIGS. 1-7. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 8:
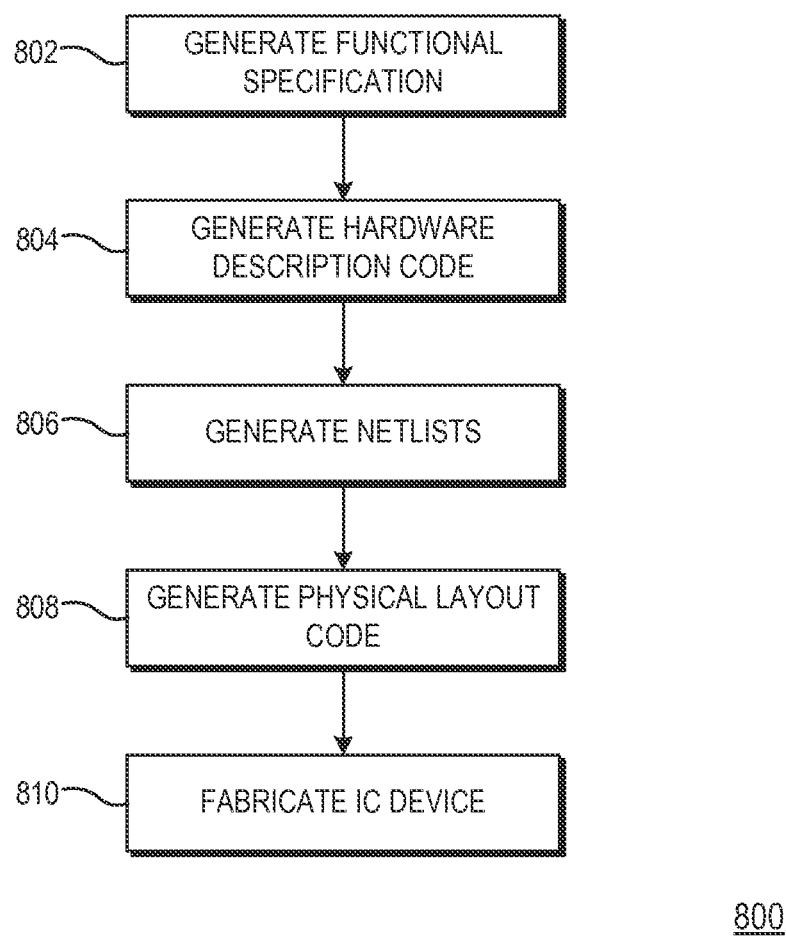
FIG. 8 is a flow diagram illustrating a method for designing and fabricating an integrated circuit device implementing at least a portion of a component of a processing system in accordance with some embodiments.

FIG. 8 is a flow diagram illustrating an example method 800 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 802 a functional specification for the IC device is generated. The functional specification (often referred to as a micro architecture specification (MAS)) may be represented by any of a variety of programming languages or modeling languages, including C, C++, SystemC, Simulink, or MATLAB.

At block 804, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, System Verilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 806 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 808, one or more EDA tools use the netlists produced at block 806 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 810, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

As disclosed herein, in some embodiments a method includes: precharging differential bitlines for a plurality of entries of a memory in response to a memory access to a memory address associated with the memory; and disabling precharging of bitlines for a first subset of the plurality of entries based on a set of predecode signals generated based on first address information to represent a partial memory address, the first address information to be decoded into the memory address, and concurrently maintaining precharging of a second subset of the plurality of entries. In some aspects, the first address information comprises a base address and an offset. In some aspects, the method includes: generating the set of predecode signals based on the first address information; and decoding the first address information into the memory address concurrent with generating the set of predecode signals. In some aspects the first address information comprises second address information and third address information, and the method further includes: generating the set of predecode signals by performing a carry-save addition of the second address information and the third address information. In some aspects the carry-save addition generates two asserted select signals, each of the two asserted select signals indicating a corresponding entry of the plurality of entries. In some aspects, the method includes selecting the first subset of the plurality of entries in response to identifying that the first subset of the plurality of entries includes both corresponding bitlines for the two asserted select signals. In some aspects, the method includes selecting the first subset of the plurality of entries in response to: identifying that the first subset of the plurality of entries includes a corresponding entry for one of the two asserted select signals and does not include a corresponding entry for the other of the two asserted select signals; and a selected bit of the first address information having an asserted state. In some aspects, the selected bit of the first address information corresponds to a most significant bit of a subset of first address information bits which are not used in generating the two asserted select signals.

In some embodiments, a processing system includes: a memory comprising a plurality of entries; a predecode module to generate a set of predecode signals based on first address information of a memory access; an address decoder to decode the first address information into a memory address; a precharge module to: precharge differential bitlines for the plurality of entries of a memory in response to the memory access; disable precharging of bitlines of a first subset of the plurality of entries, the first subset based the set of predecode signals; and maintain precharging of bitlines of a second subset of the plurality of entries concurrent with the precharging of the first subset of the plurality of entries being disabled. In some aspects the first address information comprises abuse address and an offset. In some aspects the address decoder is to: decoding the first address information into the memory address concurrent with the predecode module generating the set of predecode signals. In some aspects the first address information comprises second address information and third address information, and wherein the predecode module is to: generate the set of predecode signals by performing a carry-save addition of the second address information and the third address information. In some aspects the predecode module is to: perform the carry-save addition to generate two asserted select signals, each of the two asserted select signals indicating a corresponding entry of the plurality of entries. In some aspects the predecode module is to: select the first subset of the plurality of entries in response to identifying that the first subset of the plurality of entries includes both corresponding entries for the two asserted select signals. In some aspects the predecode module is to: select the first subset of the plurality of entries in response to: identifying that the first subset of the plurality of entries includes a corresponding entry for one of the two asserted select signals and does not include a corresponding entry for the other of the two asserted select signals; and a selected bit of the first address information being in an asserted state. In some aspects the selected bit of the first address information corresponds to a least significant bit of the first address information.

In some embodiments, a non-transitory computer readable medium embodies a set of executable instructions, the set of executable instructions to manipulate a computer system to perform a portion of a process to fabricate at least part of a processor, the processor comprising: a memory comprising a plurality of entries; a predecode module to generate a set of predecode signals based on first address information of a memory access; an address decoder to decode the first address information into a memory address; a precharge module to: precharge differential bitlines for the plurality of entries of a memory in response to the memory access; disable precharging of bitlines of a first subset of the plurality of entries, the first subset based the set of predecode signals; and maintain precharging of a bitlines of a second subset of the plurality of entries concurrent with the precharging of the first subset of the bitlines being disabled. In some aspects the first address information comprises abuse address and an offset. In some aspects the address decoder is to: decoding the first address information into the memory address concurrent with the predecode module generating the set of predecode signals. In some aspects the first address information comprises second address information and third address information, and wherein the predecode module is to: generate the set of predecode signals by performing a carry-save addition of the second address information and the third address information.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   precharging bitlines for a plurality of entries of a memory in response to a memory access to a memory address associated with the memory;
   generating a set of predecode signals based on first address information to represent a partial memory address, the first address information including a base address and an offset to be decoded into the memory address, the generating comprising:
     generating two asserted select signals, each of the asserted select signals corresponding to a different entry of the plurality of entries;
     selecting a first predefined subset of the plurality of entries in response to identifying that the first predefined subset of the plurality of entries includes both corresponding bitlines for the two asserted select signals;
     selecting a second predefined subset of the plurality of entries in response to identifying that the second predefined subset of the plurality of entries includes a corresponding entry for one of the two asserted select signals and does not include a corresponding entry for the other of the two asserted select signals, and that a selected bit of the first address information has an asserted state; and
   disabling precharging of bitlines for the selected subset of the plurality of entries based on the selected subset of the plurality of entries including an entry to be accessed by the memory access and concurrently maintaining precharging of a different subset of the plurality of entries, the different subset including an entry not to be accessed by the memory access.

2. The method of claim 1, wherein the bitlines for the plurality of entries of the memory are differential bitlines.

3. The method of claim 1, further comprising:
   generating the set of predecode signals based on the first address information; and
   decoding the first address information into the memory address concurrent with generating the set of predecode signals.

4. The method of claim 1, wherein the first address information comprises second address information and third address information, and further comprising:
   generating the set of predecode signals by performing a carry-save addition of the second address information and the third address information.

5. The method of claim 1, wherein the selected bit of the first address information corresponds to a most significant bit of a subset of first address information bits which are not used in generating the two asserted select signals.

6. A processing system comprising:
   a memory comprising a plurality of entries;
   a predecode module to generate a set of predecode signals based on first address information of a memory access, the first address information comprising a base address and an offset;
   an address decoder to decode the first address information into a memory address;
   a precharge module to:
     precharge bitlines for a plurality of entries of a memory in response to a memory access to a memory address associated with the memory;
     generate two asserted select signals, each of the asserted select signals corresponding to a different entry of the plurality of entries;
     select a first predefined subset of the plurality of entries in response to identifying that the first predefined subset of the plurality of entries includes both corresponding bitlines for the two asserted select signals;

select a second predefined subset of the plurality of entries in response to identifying that the second predefined subset of the plurality of entries includes a corresponding entry for one of the two asserted select signals and does not include a corresponding entry for the other of the two asserted select signals, and that a selected bit of the first address information has an asserted state; and disable precharging of bitlines for the selected subset of the plurality of entries based on the selected subset of the plurality of entries including an entry to be accessed by the memory access and concurrently maintaining precharging of a different subset of the plurality of entries, the different subset including an entry not to be accessed by the memory access.

7. The processing system of claim 6, wherein the bitlines for the plurality of entries of the memory are differential bitlines.

8. The processing system of claim 6, wherein the address decoder is to:
decoding the first address information into the memory address concurrent with the predecode module generating the set of predecode signals.

9. The processing system of claim 6, wherein the first address information comprises second address information and third address information, and wherein the predecode module is to:
generate the set of predecode signals by performing a carry-save addition of the second address information and the third address information.

10. The processing system of claim 6, wherein the selected bit of the first address information corresponds to a most significant bit of a subset of first address information bits which are not used in generating the two asserted select signals.

11. A non-transitory computer readable medium embodying a set of executable instructions, the set of executable instructions to manipulate a computer system to perform a portion of a process to fabricate at least part of a processor, the processor comprising:
a memory comprising a plurality of entries;
a predecode module to generate a set of predecode signals based on first address information of a memory access, the first address information comprising a base address and an offset;
an address decoder to decode the first address information into a memory address;
a precharge module to:
precharge bitlines for a plurality of entries of a memory in response to a memory access to a memory address associated with the memory;
generate two asserted select signals, each of the asserted select signals corresponding to a different entry of the plurality of entries;
select a first predefined subset of the plurality of entries in response to identifying that the first predefined subset of the plurality of entries includes both corresponding bitlines for the two asserted select signals;
select a second predefined subset of the plurality of entries in response to identifying that the second predefined subset of the plurality of entries includes a corresponding entry for one of the two asserted select signals and does not include a corresponding entry for the other of the two asserted select signals, and that a selected bit of the first address information has an asserted state; and
disable precharging of bitlines for the selected subset of the plurality of entries based on the selected subset of the plurality of entries including an entry to be accessed by the memory access and concurrently maintaining precharging of a different subset of the plurality of entries, the different subset including an entry not to be accessed by the memory access.

12. The computer readable medium of claim 11, wherein the bitlines for the plurality of entries of the memory are differential bitlines.

13. The computer readable medium of claim 11, wherein the address decoder is to:
decoding the first address information into the memory address concurrent with the predecode module generating the set of predecode signals.

14. The computer readable medium of claim 11, wherein the first address information comprises second address information and third address information, and wherein the predecode module is to:
generate the set of predecode signals by performing a carry-save addition of the second address information and the third address information.

\* \* \* \* \*

UNITED STATES PATENT AND TRADEMARK OFFICE
CERTIFICATE OF CORRECTION

PATENT NO. : 9,563,573 B2
APPLICATION NO. : 13/970735
DATED : February 7, 2017
INVENTOR(S) : Matthew T. Sobel It is certified that error appears in the above-identified patent and that said Letters Patent is hereby corrected as shown below:

In the Claims

Column 15, Line 21, Claim 8 change "decoding the first address information into the memory" to --decode the first address information into the memory--

Column 16, Line 35, Claim 13 change "decoding the first address information into the memory" to --decode the first address information into the memory--

Signed and Sealed this
Fourteenth Day of August, 2018

Andrei Iancu
*Director of the United States Patent and Trademark Office*